US012593721B2

(12) United States Patent

Burke

(10) Patent No.: US 12,593,721 B2

(45) Date of Patent: Mar. 31, 2026

(54) INTERNAL THERMAL TRANSFER FOR MEMORY DEVICE

(71) Applicant: Sandisk Technologies, Inc., Milpitas, CA (US)

(72) Inventor: John Burke, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 633 days.

(21) Appl. No.: 16/908,709

(22) Filed: Jun. 22, 2020

(65) Prior Publication Data

US 2021/0398964 A1 Dec. 23, 2021

(51) Int. Cl.
H10W 90/00 (2026.01)
H10W 40/70 (2026.01)
(52) U.S. Cl.
CPC .......... H10W 90/00 (2026.01); H10W 40/70 (2026.01)

(58) Field of Classification Search
None
See application file for complete search history.

(56) References Cited

U.S. PATENT DOCUMENTS

2015/0331460 A1* 11/2015 Mataya ..................... G06F 1/20
361/679.31
2018/0049349 A1 2/2018 Voss et al.
2018/0153031 A1 5/2018 Strader et al.
2020/0027839 A1 1/2020 Hino et al.

* cited by examiner

*Primary Examiner* — Jack S Chen
(74) *Attorney, Agent, or Firm* — DENTONS Durham Jones Pinegar

(57) ABSTRACT

Apparatuses, systems, and methods are presented for data storage with internal thermal transfer. A plurality of memory elements may be disposed within a thermally conductive housing. A controller may be disposed within the housing and thermally connected to the housing. A heat spreader may be thermally connected to the housing and to the plurality of memory elements, and not thermally connected to the controller.

20 Claims, 3 Drawing Sheets

100

Computing Device 110

| 111 | 112 | 114 | 113 |

Network 115

Storage Clients 116

| Operating System | File System | Database | ... |

Storage Client(s) 116

Memory Device 120

125

Device Controller 126

127

150

123 Memory Element(s)

Memory Media 122

129 Logical Memory Element

120a

120b

INTERNAL THERMAL TRANSFER FOR MEMORY DEVICE

TECHNICAL FIELD

The present disclosure, in various embodiments, relates to memory devices and more particularly relates to internal thermal transfer for memory devices.

BACKGROUND

Various types of memory devices may produce heat during use. Memory operations for reading or writing data may be throttled if temperatures within a memory device exceed a threshold. Controllers or power management integrated circuits for a memory device may dissipate large amounts of power, raising internal temperatures for the device above a throttling threshold.

SUMMARY

Apparatuses are presented for data storage with internal thermal transfer. An apparatus, in some embodiments, includes a thermally conductive housing. In some embodiments, a plurality of memory elements are disposed within the housing. In some embodiments, a controller is disposed within the housing and thermally connected to the housing. In further embodiments, a heat spreader is thermally connected to the housing and to the plurality of memory elements, and not thermally connected to the controller.

An apparatus, in another embodiment, includes means for housing a controller and memory elements. In some embodiments, an apparatus includes means for thermally connecting the controller and the memory elements to the means for housing. In some embodiments, an apparatus includes means for distributing heat among the memory elements. In further embodiments, the means for distributing heat among the memory elements is thermally connected to the memory elements, and not thermally connected to the controller.

Systems are presented for data storage with internal thermal transfer. A system, in some embodiments, includes a thermally conductive housing. In some embodiments, a printed circuit board (PCB) is disposed within the housing. In some embodiments, a first plurality of memory elements is disposed within the housing and coupled to a first side of the PCB. In some embodiments, a second plurality of memory elements is disposed within the housing and coupled to a second side of the PCB opposite the first side. In some embodiments, a controller is disposed within the housing, coupled to the PCB, and thermally connected to the housing via thermal interface material (TIM). In some embodiments, a first heat spreader is thermally connected to the first plurality of memory elements and to the housing. In some embodiments, a second heat spreader is thermally connected to the second plurality of memory elements and to the housing. In some embodiments, the heat spreaders are disposed to provide a thermal break between the controller and the memory elements.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
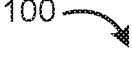
FIG. 1 is a schematic block diagram illustrating one embodiment of a system comprising one or more heat transfer components for a memory device.

Aspects of the present disclosure may be embodied as an apparatus, system, or method. Accordingly, aspects of the present disclosure may take the form of an entirely hardware embodiment, or an embodiment combining software and hardware aspects that may all generally be referred to herein as a "circuit," "module," "apparatus," or "system."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, or circuitry, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include an integrated circuit, a portion of an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams. It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more heat transfer components 150 for a memory device 120. In some embodiments, a computing device 110 may comprise a processor 111, volatile memory 112, a computer readable storage medium 114, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The memory device 120, in various embodiments, may be disposed in one or more different locations relative to the computing device 110. In one embodiment, the memory device 120 comprises one or more volatile and/or non-volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a bus 125 of the computing device 110 to communicate with storage clients 116. In one embodiment, the memory device 120 may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a Serial Advanced Technology Attachment (SATA) bus, a Parallel Advanced Technology Attachment (PATA) bus, a Small Computer System Interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a Storage Area Network (SAN), a Local Area Network (LAN), a Wide Area Network (WAN) such as the Internet, another wired and/or wireless network 115, or the like.

According to various embodiments, a device controller 126 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units may include, but are not limited to: pages, memory divisions, blocks, sectors, collections or sets of physical storage locations (e.g., logical pages, logical blocks), or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more memory devices 120. Although FIG. 1 depicts a single memory device 120, the disclosure is not limited in this regard and could be adapted to incorporate any number of memory devices 120.

The memory device 120 may comprise one or more elements 123 of volatile and/or non-volatile memory media 122, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more elements 123 of memory media 122, in certain embodiments, comprise storage class memory (SCM).

While the memory media 122 is referred to herein as "memory media," in various embodiments, the memory media 122 may more generally comprise one or more volatile and/or non-volatile recording media capable of recording data, which may be referred to as a memory medium, a storage medium, or the like. Further, the memory device 120, in various embodiments, may comprise a recording device, a memory device, a storage device, or the like. Similarly, a memory element 123, in various embodiments, may comprise a recording element, a memory element, a storage element, or the like.

The memory media 122 may comprise one or more memory elements 123, which may include, but are not limited to: chips, packages, planes, die, or the like. A device controller 126, external to the one or more memory elements 123, may be configured to manage data operations on the memory media 122, and may comprise one or more processors, programmable processors (e.g., FPGAs), ASICs, micro-controllers, or the like. In some embodiments, the device controller 126 is configured to store data on and/or read data from the memory media 122, to transfer data to/from the memory device 120, and so on.

The device controller 126 may be communicatively coupled to the memory media 122 by way of a bus 127. The bus 127 may comprise an I/O bus for communicating data to/from the memory elements 123. The bus 127 may further comprise a control bus for communicating addressing and other command and control information to the memory elements 123. In some embodiments, the bus 127 may communicatively couple the memory elements 123 to the device controller 126 in parallel. This parallel access may allow the memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the memory elements 123.

The memory device 120, in the depicted embodiment, includes one or more heat transfer components 150. In various embodiments, the memory elements 123 and the device controller 126 may dissipate power when in use, increasing the temperature within the memory device 120. In some embodiments, a device controller 126 may include power management circuitry that powers the memory elements 123 and that dissipates a large amount of power, in comparison to the amount of power dissipated by a memory element. As such, a controller 126 may have a high heat tolerance. By contrast, memory elements 123 may have a lower heat tolerance, and memory operations for reading or writing data may be throttled to prevent overheating if a temperature threshold for the memory elements 123 is exceeded. For example, if a controller 126 is rated for operation at up to 120° C. and memory elements 123 are rated for operation at up to 75° C., read and/or write operations may be throttled or slowed down to prevent the memory elements 123 from reaching 75° C.

In some devices, memory elements 123 near the controller 126 may be prone to overheating, due to the higher power dissipation by the controller 126. A housing for the memory device 120 may be thermally coupled to the controller 126 and to the memory elements 123 to conduct heat away from the controller 126 and the memory elements 123, but may also conduct heat from a controller 126 to nearby memory elements 123. Overheating of a small number of memory elements 123 near the controller 126, or of even one memory element 123, may result in throttling of read and write operations for the entire memory device 120.

Accordingly, in the depicted embodiment, one or more heat transfer components 150 may distribute heat among the memory elements 123. For example, in one embodiment, heat transfer components 150 may include a heat spreader. Rather than thermally connecting a controller 126 and memory elements 123 directly to a housing, the controller 126 may be thermally connected directly to the housing, but the memory elements 123 may be thermally connected to a heat spreader, and the heat spreader may be thermally connected to the housing, but not (directly) thermally connected to the controller 126. In such a configuration, heat transfer from the controller 126 to nearby memory elements 123 may still occur via the housing, via a printed circuit board, or by radiation or convection within the memory device 120, but the heat spreader may have a higher thermal conductivity than the housing or other materials used in the device, and may distribute or equalize heat among the memory elements 123 faster than the heat is transferred from the controller 126. In further embodiments, heat transfer components 150 may include multiple heat spreaders, thermal interface material, or the like. In various embodiments, coupling memory elements 123 to heat spreaders or other heat transfer components 150 that are not directly thermally connected to the controller 126 may prevent excessive heating of the memory elements 123 near the controller 126, thus reducing the likelihood of throttling. Various embodiments of heat transfer components 150 such as heat spreaders are described in further detail below with reference to FIGS. 2-4.

Figure 2:
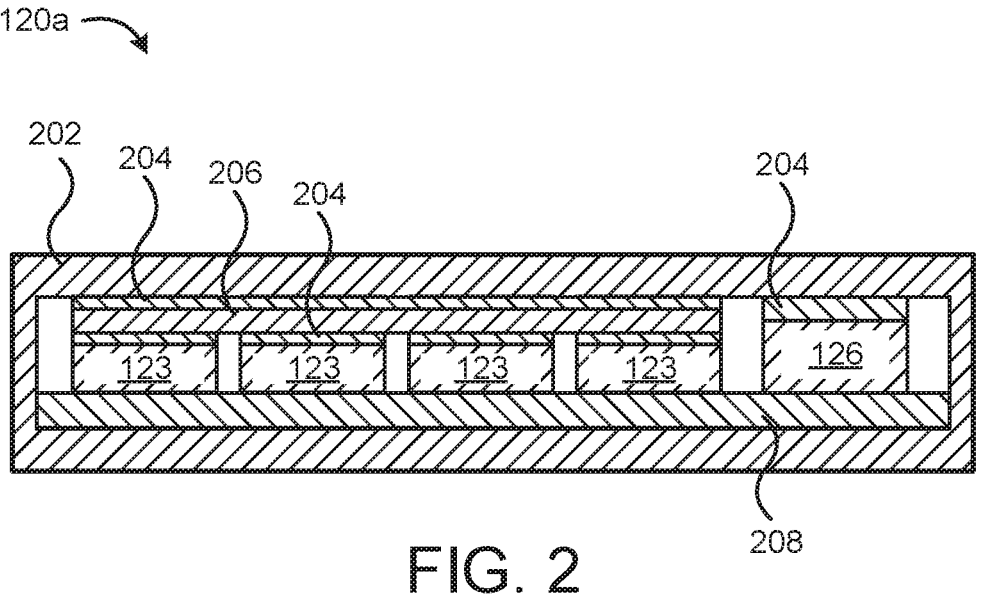
FIG. 2 is a cross section view illustrating one embodiment of a memory device with components for internal heat transfer.

FIG. 2 is a cross section view illustrating a further embodiment of a memory device 120*a*, which includes a controller 126 and a plurality of memory elements 123. The memory device 120*a*, the controller 126 and the memory elements 123 may be substantially as described above with reference to FIG. 1. In the depicted embodiment, the memory device 120*a* further includes a housing 202, a heat spreader 206, thermal interface material 204, and a printed circuit board 208.

Figure 3:
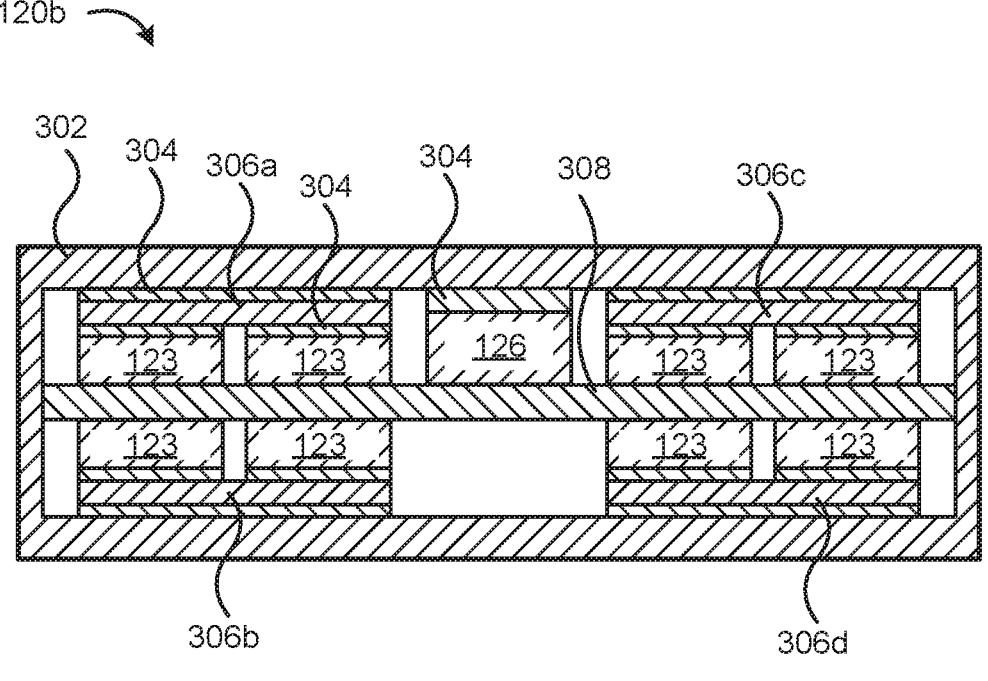
FIG. 3 is a cross section view illustrating another embodiment of a memory device with components for internal heat transfer.
Figure 4:
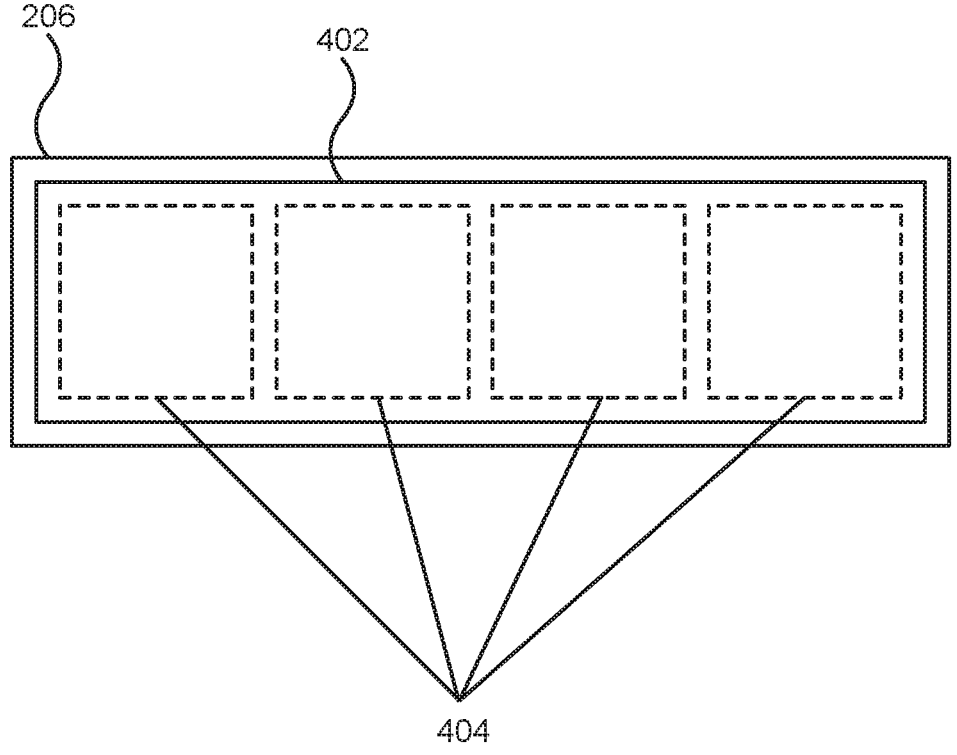
FIG. 4 is a top view illustrating one embodiment of a heat spreader.

FIGS. 2-4 illustrate relationships of various components to each other, and are not intended as limiting with regard to particular dimensions, shapes, or locations of components. In various embodiments, certain components may be larger, smaller, thicker, thinner, or a different shape than depicted. For example, in some embodiments, thermal interface material 204 may be a thin layer of thermal paste that would not be visible as more than a line in a cross section, but FIG. 2 depicts a thicker thermal interface material 204 so that the thermal interface material 204 can be more clearly seen.

In the depicted embodiment, the memory device 120*a* includes a thermally conductive housing 202. A plurality of memory elements 123 and a controller 126 are disposed within the housing 202. The memory elements 123 and the controller 126, in the depicted embodiment, are different integrated circuit packages, coupled to a printed circuit board (PCB) 208. Memory elements 123, in various embodiments, may be (or may include) chips, die, multi-die packages, or the like, that include one or more arrays of memory cells for storing data. For example, in various embodiments, memory elements 123 may include arrays of floating gate transistors for Flash memory, magnetic tunnel junctions for MRAM memory, resistors with changeable resistance for ReRAM, capacitors for DRAM, or the like. In some embodiments, memory elements 123 may include further circuitry peripheral to the memory arrays, internal controllers separate from the controller 126 to perform local or low-level operations, or the like.

A controller 126, in various embodiments, may be a device controller 126 as described above with regard to FIG. 1, which communicates with a host such as computing device 110 and with the memory elements 123 to write data from the host to the memory elements 123, or to read data from the memory elements 123 back to the host. As used herein, the term "controller" may refer to a device controller, and/or to circuitry or integrated circuit packages of a memory device 120 other than the memory elements 123 themselves. For example, if a device controller 126 does not include power management circuitry, a memory device 120 may include one or more power management integrated circuits (PMICs) separate from the device controller 126, and the PMICs may also be referred to as "controllers." Various other or further integrated circuit packages may be included as controllers in various embodiments of a memory device 120.

The thermally conductive housing 202, in the depicted embodiment, is a container or enclosure for other components such as the memory elements 123 and the controller 126. Although all materials are thermally conductive to some extent, the term "thermally conductive" is used herein to refer to materials capable of significant heat conduction. For example, any material used to conduct heat in a commercially available heat sink may be referred to as a thermally conductive material, while materials used for thermal insulation would not be referred to herein as thermally conductive materials. Thus, in various embodiments a thermally conductive housing 202 may be formed from (or made at least in part of) one or more thermally conductive metals or alloys, or other materials with thermal conductivities equal to or greater than metals. For example, in one embodiment, a thermally conductive housing 202 includes or is made at least in part from aluminum.

The controller 126, in various embodiments, is thermally connected to the housing 202. Two components may be referred to herein as "thermally connected" if they are in direct contact, or if they are connected via a thermal interface material (TIM) 204 as described below. Thus, heat flow between two thermally connected components, or across a thermal connection, may be primarily by conduction from one component directly to the other, or nearly directly to the other component through the TIM 204. Conversely, where heat flow between two components is primarily by radiation, convection, or conduction via a third component other than TIM 204, the two components would not be described herein as thermally connected. For example, in FIG. 2, the controller 126 is thermally connected to the housing 202 via TIM 204, and is thermally connected to the PCB 208 because it is in direct contact with the PCB 208. However, the controller 126 is not thermally connected to the memory elements 123, even though heat transfer from the controller 126 to the memory elements 123 may occur through the housing 202, the PCB 208, the air inside the housing 202, and the like.

In the depicted embodiment, the thermal connection between the controller 126 and the housing 202 includes a thermal interface material 204. A thermal interface material 204, or TIM, may be a material that improves heat conduction between two components as compared to direct contact between the two components. In some embodiments, TIM 204 may fill small gaps or air spaces between two components to improve heat conduction between the two components. In various embodiments, a TIM 204 may be a thermal paste, a thermal glue, a thermal tape, a thermally conductive pad, a silicone pad, a pad of a phase change material that melts into gaps between components, or the like. Various commercially available TIMs 204 may be used in various embodiments of a memory device 120*a*. In another embodiment, however, some thermally connected components such as the controller 126 and the housing 202 may be directly connected without a TIM 204.

In the depicted embodiment, a heat spreader 206 is thermally connected to the housing 202 and to the plurality of memory elements 123. In some embodiments, a memory device 120 may include multiple heat spreaders 206, where each of the heat spreaders 206 is coupled to a different plurality or group of memory elements 123. In the depicted embodiment, the thermal connections between the heat spreader 206 and the housing 202, and between the heat spreader 206 and the memory elements 123 include a TIM 204. In another embodiment, however, some of the thermal connections may be direct contact between components without a TIM 204. One or more heat spreaders 206 (and TIM 204, if used) may be heat transfer components 150 as described above with reference to FIG. 1.

A heat spreader 206, in various embodiments, may be a component formed from thermally conductive material to distribute heat across an area or throughout a region. Thus, the heat spreader 206 may distribute heat or reduce temperature variations across the memory elements 123 that are thermally connected to the heat spreader 206. Using a heat spreader 206 to distribute heat among multiple memory elements 123, in various embodiments, may increase the time-to-throttle for a memory device 120*a* by preventing or mitigating overheating of the memory elements 123 nearest to the controller 126. For example, a memory device 120*a* incorporating a heat spreader 206 may eventually throttle memory operations when the heat from the controller 126 heats multiple memory elements 123 to or near a threshold temperature, but will operate at full speed without throttling for a longer time than a memory device without a heat spreader, which may throttle when the memory element closest to the controller 126 gets hot.

Additionally, in various embodiments, a heat spreader 206 may be disposed to provide thermal communication among the memory elements 123 and to provide a thermal break between the controller 126 and the memory elements 123. A thermal break may be a region of reduced thermal conduction compared to thermal communication in another region of higher thermal conduction. For example, in the depicted embodiment, the heat spreader 206 thermally connected to the memory elements 123, thus providing thermal communication among the memory elements 123, but is not thermally connected to the controller 126, thus providing a thermal break between the controller 126 and the memory elements 123.

In certain embodiments, coupling components that produce heat such as the controller 126 and the memory elements 123 to a thermally conductive housing 202 may facilitate heat transfer away from a memory device 120, but may also transfer heat in undesirable ways among components. For example, heat from the controller 126 may create a hot spot in the housing 202. The controller 126 may be thermally connected to the housing 202 in such a way that, during operation of the controller 126 and the memory elements 123, at least a portion of the housing 202 proximate to the controller 126 is hotter than the memory elements 123.

Where a portion of the housing 202 is hotter than the memory elements 123, heat transfer via the housing 202 may not just be heat transfer away from the memory device 120*a*, but may also include heat transfer back into the memory device 120*a*. If the housing 202 is hottest near the controller 126, then memory elements 123 near the controller 126 may be prone to overheating, in the absence of a heat spreader 206, due to heat transfer from the housing 202 back into the memory device 120*a*. Thus, a heat spreader 206 that provides thermal communication among the memory elements 123 may avoid or mitigate overheating of individual memory elements 123. Additionally, a heat spreader 206 that provides a thermal break between the controller 126 and the memory elements 123 does not fully eliminate the problem of heat transfer from the controller 126 to the memory elements 123 through the housing 202, but avoids creating a new problem of heat transfer from the controller 126 to the memory elements 123 through the heat spreader 206 itself. Directing the heat produced by the controller 126 through the housing 202 may increase the likelihood of the heat being transferred away from the memory device 120*a* rather than back into it.

A heat spreader 206, in some embodiments, may be formed from a material with a greater thermal conductivity than the housing 202. For example, where the housing 202 is formed or made in part from aluminum, a heat spreader 206 may include or be made from copper or silver. In some embodiments, a heat spreader 206 may be formed from an electrically conductive metal. For example, a heat spreader 206 may include or be made from aluminum, copper, silver, or the like. In some embodiments, a heat spreader 206 may be formed from a non-electrically conductive ceramic. For example, a heat spreader 206 may include or be made from aluminum nitride ceramic, or another ceramic with a similar heat transfer coefficient to aluminum nitride.

TIM 204, in some embodiments, may facilitate thermal connections between components by filling gaps or surface irregularities with a material that has a significantly higher thermal conductivity than the air that would otherwise occupy those regions. However, TIM 204 itself may have a low thermal conductivity compared to metals. For example, TIM 204 in some embodiments may have a thermal conductivity of three to four watts per meter-kelvin, whereas many metals or other heat spreader materials may have a thermal conductivity several times higher. Thus, the use of a heat spreader 206 may significantly increase heat distribution among the memory elements 123 compared to using TIM 204 without a heat spreader 206.

Accordingly, in some embodiments, a heat spreader 206 may be formed from a material with a thermal conductivity at least ten times greater than a thermal conductivity of the TIM 204. In some embodiments, thermal conductivity of a heat spreader 206 may be at least five times greater, at least twenty times greater, or at least fifty times greater than thermal conductivity of the TIM 204. In some embodiments, the TIM 204 may have a thermal conductivity of less than ten watts per meter-kelvin. For example, a thermal paste used as a TIM 204 may have a conductivity in a range from three to eight watts per meter-kelvin. By contrast, in some embodiments, the heat spreader 206 may be formed from a material with a thermal conductivity of at least one hundred watts per meter-kelvin. For example, aluminum, copper, silver, and aluminum nitride all have thermal conductivities well over one hundred watts per meter-kelvin, and may be suitable for use in a heat spreader 206. In some embodiments, the heat spreader 206 may be formed from a material with a thermal conductivity of at least 100 watts per meter-kelvin, at least 150 watts per meter-kelvin, at least 200 watts per meter-kelvin, at least 300 watts per meter-kelvin, or more.

FIG. 3 is a cross section view illustrating another embodiment of a memory device 120*b* with components for internal heat transfer. The memory device 120*b* in the depicted embodiment, may be substantially as described above with reference to FIGS. 1 and 2. In the depicted embodiment, the memory device 120*b* includes a housing 302, TIM 304, heat spreaders 306, a PCB 308, memory elements 123, and a controller 126, which may be substantially as described above with reference to FIGS. 1 and 2.

However, in the depicted embodiment, the memory device 120*b* includes multiple pluralities or groups of memory elements 123, and multiple heat spreaders 306. In addition, while FIG. 2 depicts a memory device 102*a* with a single-sided PCB 208, the memory device 102*b* in the depicted embodiment, includes a double-sided PCB 308, with memory elements 123 on both sides. For example, a first heat spreader 306*a* is thermally connected (e.g., via TIM 304) to a first plurality of memory elements 123, and a second heat spreader 306*b* is thermally connected (e.g., via TIM 304) to a second plurality of memory elements 123. In the depicted embodiment, four heat spreaders 306 are thermally connected via TIM 304 to four groups or pluralities of memory elements 123. In another embodiment, the number of heat spreaders 306 and the corresponding number of groups or pluralities of memory elements 123 may be more or fewer than four. The heat spreaders 306 in the depicted embodiment are thermally connected to corresponding groups or pluralities of memory elements 123, and to the housing 302, but are not thermally connected to the controller 126.

In the depicted embodiment, the controller 126 and multiple memory elements 123 are coupled to a first side of the PCB 308, and additional memory elements 123 are coupled to a second side of the PCB 308 opposite the first side. In the depicted embodiment, with the controller 126 centrally located on the first side of the PCB 308, the memory elements 123 on that side are divided into two groups with separate heat spreaders 306a, 306c, so that both of the heat spreaders 306a, 306c provide thermal communication among groups of memory elements 123 and a thermal break between the controller 126 and the memory elements 123. In another embodiment, the controller 126 may be more peripherally located, and a single heat spreader 306 may be used on the first side of the PCB 308. Similarly, on the opposite side of the PCB 308, multiple heat spreaders 306 may be used (e.g., for manufacturing convenience to match the heat spreaders 306 on the first side), or a single heat spreader 306 may be used in the absence of a controller 126 on that side.

FIG. 4 is a top view illustrating one embodiment of a heat spreader 206. The heat spreader 206, in the depicted embodiment, may be substantially as described above with reference to FIGS. 1-3. A first portion 402 of the heat spreader 206, where the heat spreader 206 contacts the housing 202, is illustrated by a solid line. In the depicted embodiment, the first portion 402 is nearly the full upper side of the heat spreader 206. In another embodiment the portion 402 that contacts the housing 202 may be a different shape or may be interrupted by irregularities in the extent of the TIM 204, the shape of the housing 202, or the like. A second portion 404 of the heat spreader 206, where the heat spreader 206 contacts the memory elements 123, is illustrated by dashed lines. In the depicted embodiment, the second portion 404 is not a continuous region, but is a set or sum of disconnected regions where the lower side of the heat spreader 206 contacts individual memory elements 123.

In the depicted embodiment, the first portion 402 of the heat spreader 206, where the heat spreader 206 contacts the housing 202, is directly across the heat spreader from the second portion 404 of the heat spreader 206, where the heat spreader 206 contacts the memory elements 123. Sandwiching a heat spreader 206 between memory elements 123 and a housing 202 in this manner may facilitate both heat distribution among the memory elements 123 and heat transfer away from the memory elements 123, even if it also facilitates heat transfer from the housing 202 into the memory elements 123 near the controller 126. By contrast, other heat spreaders in other types of devices may spread heat laterally among components without being sandwiched between the components and a housing.

Means for housing a controller 126 and memory elements 123, in various embodiments, may include a housing 202, 302, a thermally conductive material, aluminum, other metal, or the like. Other embodiments may include similar or equivalent means for housing a controller 126 and memory elements 123.

Means for thermally connecting the controller 126 and the memory elements 123 to the means for housing, in various embodiments, may include a TIM 204, 304, a thermal paste, a thermal glue, a thermal tape, a thermally conductive pad, a silicone pad, a pad of a phase change material that melts into gaps between components, or the like. Other embodiments may include similar or equivalent means for thermally connecting the controller 126 and the memory elements 123 to the means for housing.

Means for distributing heat among memory elements 123, in various embodiments, may include one or more heat spreaders 206, 306, one or more electrically conductive metals, one or more non-electrically conductive ceramics, copper, silver, aluminum nitride, or the like. Other embodiments may include similar or equivalent means for distributing heat among memory elements 123.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
a thermally conductive housing;
a controller disposed within a first area of the thermally conductive housing, the first area of the thermally conductive housing comprising:
a first thermal interface material (TIM) thermally connecting the controller to the thermally conductive housing;
a plurality of memory elements disposed within a second area of the thermally conductive housing, the second area of the thermally conductive housing comprising:
a heat spreader positioned between the plurality of memory elements and the second area of the thermally conductive housing; and
a second TIM positioned between the heat spreader and the second area of the thermally conductive housing and thermally connecting the plurality of memory elements to the thermally conductive housing such that during operation of the controller and the memory elements, at least a portion of the thermally conductive housing proximate to the controller is hotter than the memory elements.

2. The apparatus of claim 1, wherein the heat spreader defines a thermal break between the controller and the memory elements.

3. The apparatus of claim 1, wherein the heat spreader has a greater thermal conductivity when compared with a thermal conductivity of at least one of the first TIM and the second TIM.

4. The apparatus of claim 1, wherein the heat spreader has a thermal conductivity of at least 100 watts per meter-kelvin and wherein at least one of the first TIM and the second TIM has a thermal conductivity of less than 10 watts per meter-kelvin.

5. The apparatus of claim 1, wherein the heat spreader is formed from a material with a greater thermal conductivity than the thermally conductive housing.

6. The apparatus of claim 1, wherein the thermally conductive housing comprises aluminum.

7. The apparatus of claim 1, wherein the heat spreader is formed from an electrically conductive metal.

8. The apparatus of claim 1, wherein the heat spreader is formed from at least one of: copper, silver, and aluminum nitride.

9. The apparatus of claim 1, further comprising a third TIM positioned between the heat spreader and the plurality of memory elements.

10. An apparatus, comprising:
means for housing a controller and memory elements;
means for separately thermally connecting the controller and the memory elements to the means for housing; and
means for distributing heat among the memory elements, wherein the means for distributing heat among the memory elements is located between the memory elements and the means for housing to thermally connect the means for housing to the memory elements, such that during operation of the controller and the memory elements, at least a portion of the means for housing proximate to the controller is hotter than the memory elements.

11. The apparatus of claim 10, wherein a thermal conductivity of the means for distributing heat among the memory elements is at least 100 watts per meter-kelvin.

12. The apparatus of claim 10, wherein a thermal conductivity of the means for thermally connecting the controller and the memory elements to the means for housing is less than 10 watts per meter-kelvin.

13. The apparatus of claim 10, wherein the means for distributing heat among the memory elements defines a thermal break between the controller and the memory elements.

14. The apparatus of claim 10, wherein the means for separately thermally connecting the controller and the memory elements to the means for housing includes a first thermal interface material (TIM) thermally connecting the controller to the means for housing and a second TIM positioned between the means for distributing heat among the memory elements.

15. The apparatus of claim 10, wherein the means for distributing heat is formed from at least one of: copper, silver, and aluminum nitride.

16. An apparatus, comprising:

a thermally conductive housing;

a controller disposed within a first area of the thermally conductive housing, the first area of the thermally conductive housing comprising:

a first thermal interface material (TIM) directly connecting the controller to the thermally conductive housing;

a plurality of memory elements disposed within a second area of the thermally conductive housing, the second area of the thermally conductive housing comprising:

a heat spreader positioned between the plurality of memory elements and the second area of the thermally conductive housing and defining a thermal break between the first area of the thermally conductive housing and the second area of the thermally conductive housing; and a second TIM positioned between the heat spreader and the second area of the thermally conductive housing and thermally connecting the plurality of memory elements to the thermally conductive housing.

17. The apparatus of claim 16, wherein the heat spreader and the second TIM cause at least a portion of the thermally conductive housing proximate to the memory elements to be cooler than at least a portion of the thermally conductive housing proximate to the controller.

18. The apparatus of claim 16, wherein the heat spreader has a greater thermal conductivity when compared with a thermal conductivity of at least one of the first TIM and the second TIM.

19. The apparatus of claim 16, further comprising a third TIM positioned between the heat spreader and the plurality of memory elements.

20. The apparatus of claim 16, wherein the heat spreader is formed from a material with a greater thermal conductivity than the thermally conductive housing.

* * * * *